(12) United States Patent
Takabayashi et al.

(10) Patent No.: US 6,727,596 B2
(45) Date of Patent: Apr. 27, 2004

(54) SEMICONDUCTOR INTEGRATED CIRCUIT

(75) Inventors: Tsutomu Takabayashi, Tokyo (JP);
Shizuo Morizane, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/917,883

(22) Filed: Jul. 31, 2001

(65) Prior Publication Data

US 2002/0130424 A1 Sep. 19, 2002

(30) Foreign Application Priority Data

Mar. 19, 2001 (JP) ........................................ 2001-078628

(51) Int. Cl.[7] .............................................. H01L 23/48
(52) U.S. Cl. ........................ 257/786; 257/780; 257/781; 257/782; 257/783; 257/784; 257/785; 257/786; 257/691
(58) Field of Search ................................ 257/780–786, 257/691, 203, 207, 210, 776, 773, 484

(56) References Cited

U.S. PATENT DOCUMENTS

| 4,947,233 | A | * | 8/1990 | Aso | .............. | 357/65 |
|---|---|---|---|---|---|---|
| 5,581,109 | A | * | 12/1996 | Hayashi et al. | .............. | 257/503 |
| 6,091,089 | A | * | 7/2000 | Hiraga | .............. | 257/203 |
| 6,207,476 | B1 | * | 3/2001 | Zhao et al. | .............. | 438/112 |
| 6,287,482 | B1 | * | 9/2001 | Hamura et al. | .............. | 257/202 |
| 6,323,559 | B1 | * | 11/2001 | Chan et al. | .............. | 257/778 |

FOREIGN PATENT DOCUMENTS

| JP | 2-244755 | 9/1990 |
|---|---|---|
| JP | 4-116851 | 4/1992 |
| JP | 5-198679 | 8/1993 |
| JP | 6-232267 | 8/1994 |

* cited by examiner

*Primary Examiner*—Nathan J. Flynn
*Assistant Examiner*—Fazu Erden
(74) *Attorney, Agent, or Firm*—Leydig, Voit & Mayer, Ltd.

(57) ABSTRACT

Bump areas for signals are spread on upper and lower positions with respect to Vdd and Vss lines in an I/O buffer. Thus, the direction of routing the lines from bumps for signals to the I/O buffers is spread in two directions. A greater number of I/O buffers can be accommodated without increasing the size of a semiconductor integrated circuit.

6 Claims, 10 Drawing Sheets

FIG.12A
FIG.12B
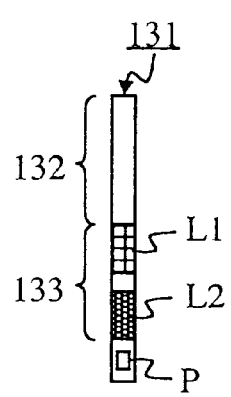
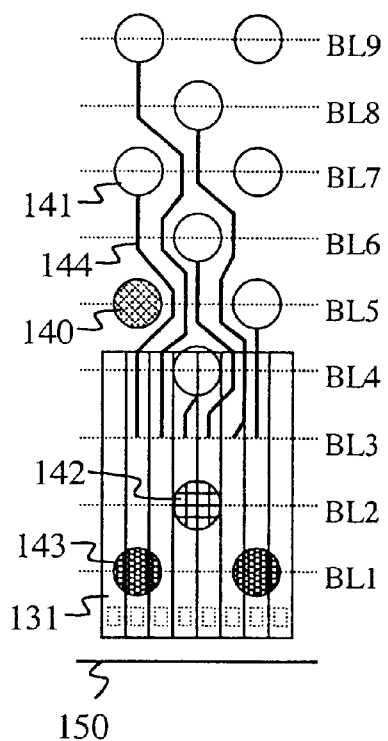

SEMICONDUCTOR INTEGRATED CIRCUIT

FIELD OF THE INVENTION

The present invention relates to a semiconductor integrated circuit having a plurality of input/output buffers for buffering signals inputted/outputted to/from input/output terminals.

BACKGROUND OF THE INVENTION

With a background of highly advanced computerization and society requesting higher precision of information, larger number of bits in a process signal is required. As a result, semiconductor integrated circuits are required to process a greater number of signals. In other words, semiconductor integrated circuits are required to have a large number of input/output signals. Under present circumstances, such a demand is addressed by reducing the size of the semiconductor integrated circuit. In order to reduce the size, however, technical reforms regarding processing are necessary, and considerable time is required to accumulate techniques to achieve the reforms.

FIG. 11 is a schematic configuration diagram of a conventional semiconductor integrated circuit. FIGS. 12A and 12B are diagrams for explaining an I/O buffers 131 shown in FIG. 11. In the conventional semiconductor integrated circuit 100 shown in FIG. 11, all the I/O buffers 131 are disposed so that their orientations to a pad P shown in FIG. 12A are perpendicular to a dicing lines 150 of the semiconductor integrated circuit 100.

Each of the I/O buffers 131 is disposed at an outermost portion to make a chip core area 120 wider. Consequently, in the semiconductor integrated circuit 100, a bump 141 for a signal to be connected to the I/O buffer 131 is disposed in a bump area 121 for signals on the chip core area 120 side. In FIG. 12A, reference number 132 denotes a pre-buffer, and 133 indicates a final driver. In FIGS. 11 and 12A, reference symbol L1 and L2 denote a power source voltage line ("Vdd line") for supplying a voltage to the final driver 133 and a GND line ("Vss line"), respectively.

In the conventional semiconductor integrated circuit, however, the size of the I/O buffer 131 is under constraints of routing of a line for connecting a bump on the inside and a pad P. The maximum number of I/O buffers 131 which can be mounted on a semiconductor integrated circuit is determined by the chip size. In other words, even if the size of a circuit (such as a gate array) occupying the chip core area 120 is small, the semiconductor integrated circuit has to be large as a whole to assure the necessary number of input/output terminals. Consequently, wasted space is generated in the chip core area 120.

For example, as shown in FIG. 12B, near the I/O buffers 131 arranged in parallel, bumps such as the bump 141 for a signal, a bump 140 for a core power source, a bump 142 for the Vdd line, and a bump 143 for the Vss line are disposed with predetermined positioning relations on bump placement lines BL1 to BL9 arranged at predetermined intervals under constraints of the routing of lines. In FIG. 12B, due to the constraints, the six bumps 141 for signals on the chip core area 120 are disposed on the bump placement lines BL4 to BL9 and the six I/O buffers 131 are connected to each other in a one-to-one corresponding manner. Specifically, under the constraints, the bump placement line BL9 is the upper limit of the bump placement lines which can be connected to the I/O buffer 131. The upper limit is not changed even when the width of each I/O buffer 131 is simply reduced.

Further, since all the I/O buffers 131 are oriented perpendicular to the dicing lines 150 of the semiconductor integrated circuit 100, as shown in FIG. 11, free areas 140 are formed at the four corners of the semiconductor integrated circuit 100.

SUMMARY OF THE INVENTION

It is an object of this invention to provide a semiconductor integrated circuit that can accommodate more I/O buffers without increasing the size. In other words, the object is to provide a semiconductor integrated circuit with a reduced wasted chip core area by changing the positions or orientations of I/O buffers positioning on the same side.

The semiconductor integrated circuit according to one aspect of this invention comprises a plurality of input/output pads provided along a periphery of the semiconductor integrated circuit; a plurality of I/O buffers which buffer signals inputted/outputted to/from the input/output pads; a first bump area for signal constructed by a bump for signal as an input/output bump of a chip core and disposed on a chip core area side with respect to the I/O buffers; and a second bump area for signal constructed by a bump for signal as an input/output bump of the chip core and disposed on the periphery with respect to the I/O buffers. The I/O buffers are disposed in positions sandwiched by the first and the second bump areas, and connected to the bump for signal in the first and second bump areas for signal.

According to the invention, the I/O buffers are disposed in positions sandwiched by the two bump areas for signals, so that the routing of a line from the bump for signal to the I/O buffer can be spread into two directions.

The semiconductor integrated circuit according to another aspect of this invention comprises a plurality of input/output pads provided along a periphery of the semiconductor integrated circuit; a plurality of I/O buffers which buffer signals inputted/outputted to/from the input/output pads, in each of which a first end portion, a power line connection portion, a GND line connection portion, and a second end portion are sequentially placed. The plurality of I/O buffers including a first I/O buffer in which the input/output pad is disposed between the first end portion and the power line connection portion; and a second I/O buffer in which the input/output pad is disposed between the second end portion and the GND line connection portion.

According to the invention, the first and second I/O buffers having the input/output pads positioned relative to each other are provided, according to the presence or absence of a through hole for connecting the power source line and the GND line, the first and second I/O buffers are selectively properly placed. Consequently, it can be prevented that a bypass line is used as the line connecting the input/output pad and the bump.

The semiconductor integrated circuit according to still another aspect of this invention comprises a plurality of input/output pads provided along a periphery of the semiconductor integrated circuit; a plurality of I/O buffers which buffer signals inputted/outputted to/from the input/output pads. The plurality of I/O buffers includes a first I/O buffer constructed by sequentially placing a first end portion, a power line connection portion, a GND line connection portion; and a second end portion and a second I/O buffer constructed by replacing the position of the power line connection portion and the position of the GND line connection portion with each other in the first I/O buffer. A rectangle is formed by disposing the first I/O buffers in parallel in four sides, and the second I/O buffers are disposed at four corners of the rectangle so that the power line connection portion in the second I/O buffer is connected to a power line to be connected to the power line connection portion in the first I/O buffer, and the GND line connection portion in the second I/O buffer is connected to a GND line to be connected to the GND line connection portion in the first I/O buffer.

According to the invention, the second I/O buffers oriented opposite to the first I/O buffers arranged in parallel in the four sides can be disposed at the four corners which are conventionally free areas.

Other objects and features of this invention will become apparent from the following description with reference to the accompanying drawings.

BRIEF DESCRIPTION OF THE DRAWINGS

FIGS. 12A and 12B are diagrams for explaining I/O buffers in the conventional semiconductor integrated circuit.

DESCRIPTION OF THE PREFERRED EMBODIMENTS

Embodiments of a semiconductor integrated circuit according to the invention will be described in detail below with reference to the accompanying drawings. However, the invention is not limited by the embodiments.

First, a semiconductor integrated circuit according to a first embodiment will be described. In the conventional semiconductor integrated circuit, all of bumps for signals on a chip core area side for connection to I/O buffers are disposed on the chip core area side with respect to a Vdd line and a Vss line of a final driver in the I/O buffer. Consequently, a line for connecting each bump and the I/O buffer is routed in one direction. In contrast, the semiconductor integrated circuit according to the first embodiment is characterized in that the bumps for signals on the chip core side are disposed so as to be spread in the upper and lower sides (in the sheet) with respect to the Vdd line and the Vss line, thereby spreading the routing directions of lines.

Figure 1:
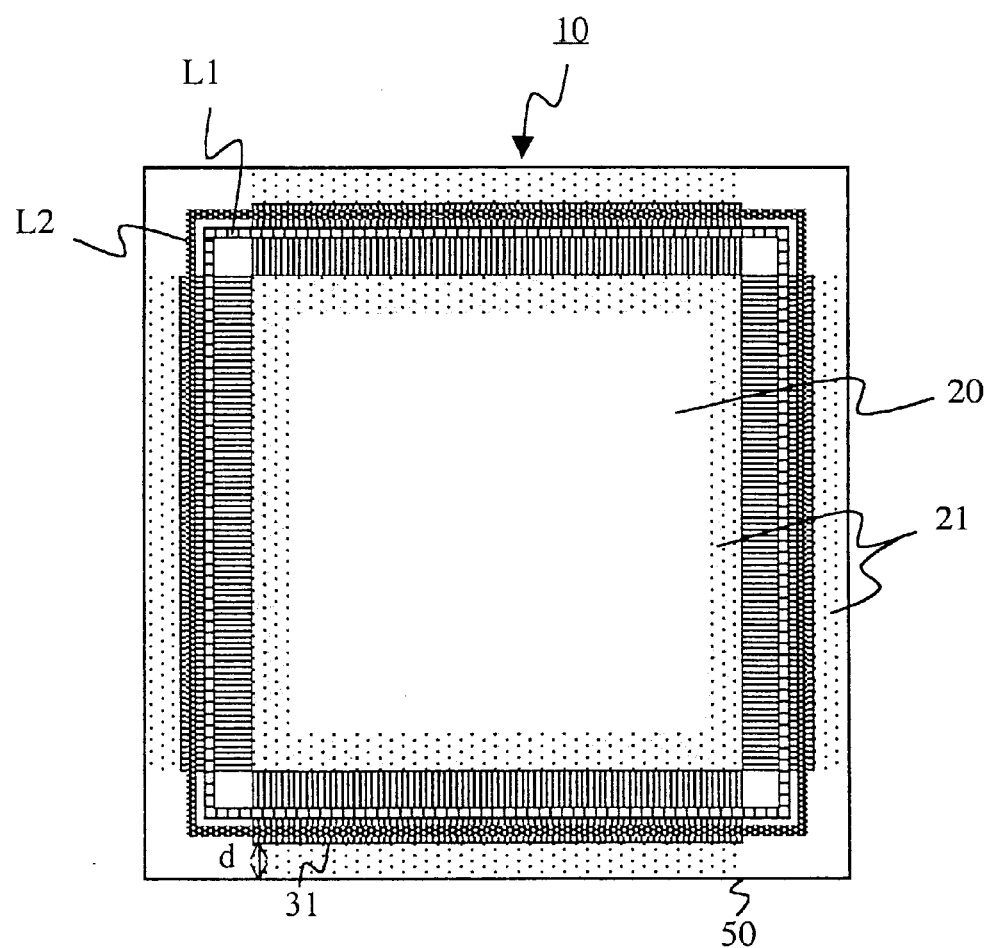
FIG. 1 is a schematic configuration diagram of a semiconductor integrated circuit according to a first embodiment.
Figure 2A:
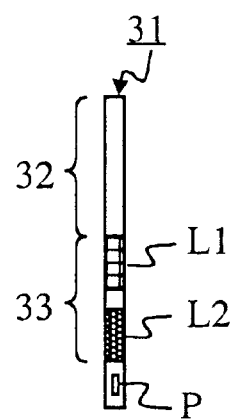
FIGS. 2A and 2B are diagrams for explaining an I/O buffer in the semiconductor integrated circuit according to the first embodiment.
Figure 2B:
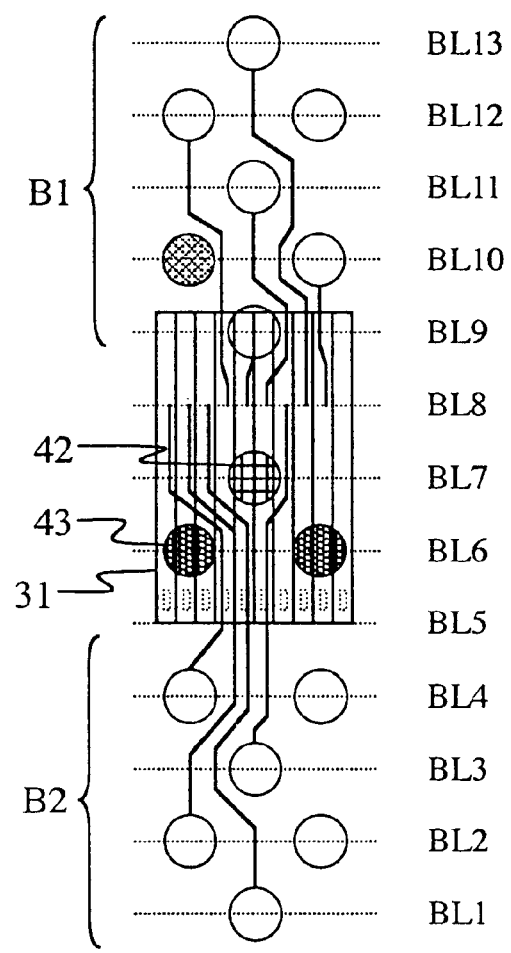

FIG. 1 is a schematic configuration diagram of a semiconductor integrated circuit according to the first embodiment. FIGS. 2A and 2B are diagrams for explaining an I/O buffer 31 shown in FIG. 1. In the semiconductor integrated circuit 10 according to the first embodiment, the I/O buffers 31 are disposed with a distance (d) from each of the dicing line 50 so that all the orientations of the I/O buffers 31 to the pad P in FIG. 2A are perpendicular to the dicing lines 50 of the semiconductor integrated circuit 10. In FIG. 2A, reference numeral 32 denotes a prebuffer and 33 indicates a final driver. In FIGS. 1 and 2A, L1 and L2 denote a Vdd line and a Vss line as power source lines of the final driver 33.

As shown in FIG. 2B, the I/O buffers 31 are arranged so that two groups B1 and B2 of bumps for signals in a chip core area 20 are positioned on the upper and lower sides in the drawing sheet. It means that a bump area 21 for signals is divided in two areas in FIG. 1. In FIG. 2B, reference numeral 42 denotes a bump for the Vdd line, and 43 indicates a bump for the Vss line.

In such a layout, regarding lines for connecting the I/O buffers 31 and the bumps for signals, the lines from the bumps for signals belonging to the group B1 are routed downward from the upper part of the drawing sheet, and the lines from the bumps via the pads P for signals belonging to the group B2 are routed upward from the lower part of the drawing sheet. That is, it is unnecessary to route the lines concentratedly in one direction.

For example, as shown in FIG. 2B, around the I/O buffers 31 arranged in parallel, the bumps for signals belonging to the group B1 are arranged on bump placement lines BL9 to BL13 at the same intervals as conventional ones in predetermined positional relations. The bumps for signals belonging to the group B2 are disposed on the bump placement lines BL1 to BL4 at the same intervals as conventional ones in predetermined positional relations. In FIG. 2B, under the constrains of lines, the lines from the five bumps for signals belonging to the group B1 and the lines from the four bumps for signals belonging to the group B2 are routed toward the I/O buffers 31 positioned in the center.

The placement width of bumps for signals shown in FIG. 2B is the same as that shown in FIG. 12B. Specifically, in the same placement width of the bumps for signals, in the semiconductor integrated circuit shown in FIG. 12B, the six bumps 141 for signals placed on the bump placement lines BL4 to BL9 and the six I/O buffers 131 are connected to each other in a one-to-one corresponding manner. In contrast, in the semiconductor integrated circuit according to the first embodiment, lines can be routed to the I/O buffers 31 from total nine bumps for signals placed on the bump placement lines BL1 to BL4 and BL9 to BL13.

It means that the I/O buffer 31 can be made narrower than the conventional I/O buffer 131 and the nine I/O buffers 31 can be connected to the nine bumps for signals in a one-to-one corresponding manner. In other words, in the semiconductor integrated circuit 10 having the same size as that of the conventional semiconductor integrated circuit, the larger number of I/O buffers 31 can be disposed.

As described above, in the semiconductor integrated circuit according to the first embodiment, since the bumps for signals in the chip core area are disposed in the upper and lower sides of the I/O buffers, the lines routed from the bumps for signals to the I/O buffers can be spread in two directions. As a result, the larger number of lines as compared with the conventional technique can be routed toward the I/O buffer placement area having a predetermined width. That is, in the I/O buffer placement area having a predetermined width, a larger number of I/O buffers, each of which is narrower than the conventional I/O buffer, can be disposed. As a result, the size of the I/O buffer can be reduced, and the number of I/O buffers, that is, the number of input/output signals can be increased.

A semiconductor integrated circuit according to a second embodiment will now be described. The semiconductor integrated circuit according to the second embodiment is characterized in that the pad P in the I/O buffer in the semiconductor integrated circuit according to the first embodiment is disposed on a prebuffer side with respect to the Vdd line L1 and the Vss line L2.

Figure 3:
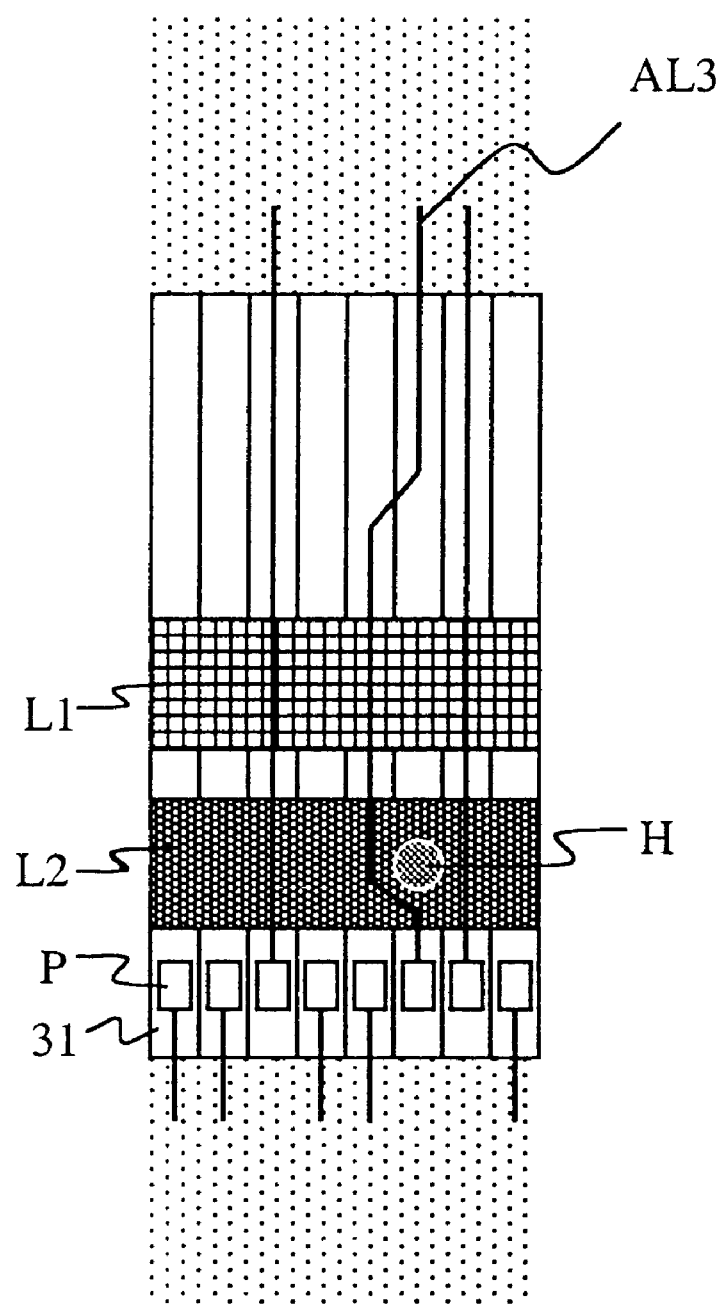
FIG. 3 is a diagram for explaining an I/O buffer in the semiconductor integrated circuit according to first embodiment.

FIG. 3 is a diagram for explaining the semiconductor integrated circuit according to the first embodiment. As shown in FIG. 3, when it is necessary to connect a bump for signal on the chip core area 20 side to the pad P of the I/O buffer having an upper layer in which a through hole H for connecting the final driver 33 and the Vss line L2 is formed, in the semiconductor integrated circuit according to the first embodiment, a line bypassing the through hole H like a line AL3 has to be formed. A bypass line such as the line AL3 is, however, not preferred since an influence is exerted to the routing of the other lines.

In the semiconductor integrated circuit according to the second embodiment, therefore, for the I/O buffer 31 in which the through hole H is positioned on the Vss line L2 (or Vdd line L1), a pad is disposed on the chip core area 20 side with respect to the Vdd line L1 and the Vss line L2.

Figure 4:
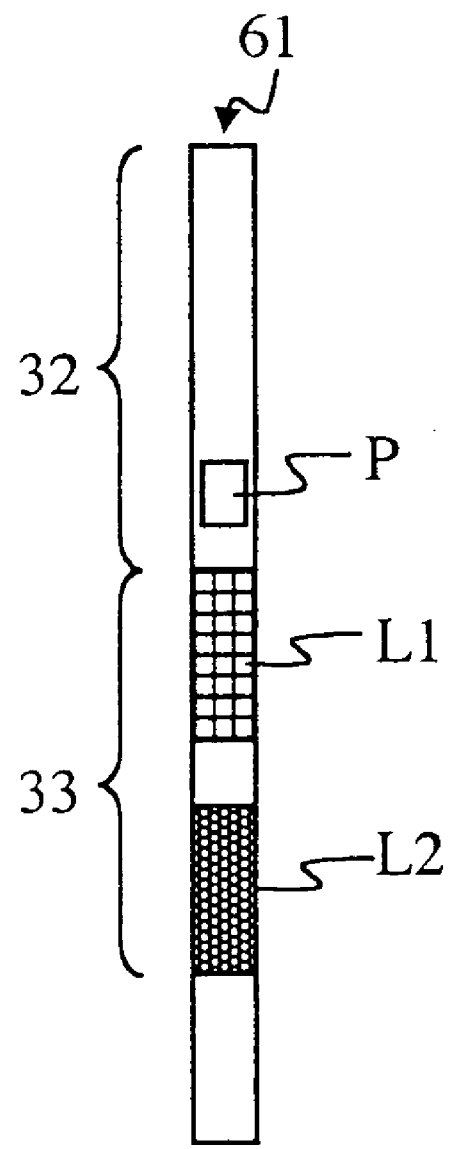
FIG. 4 is an enlarged view of an I/O buffer in a semiconductor integrated circuit according to a second embodiment.
Figure 5:
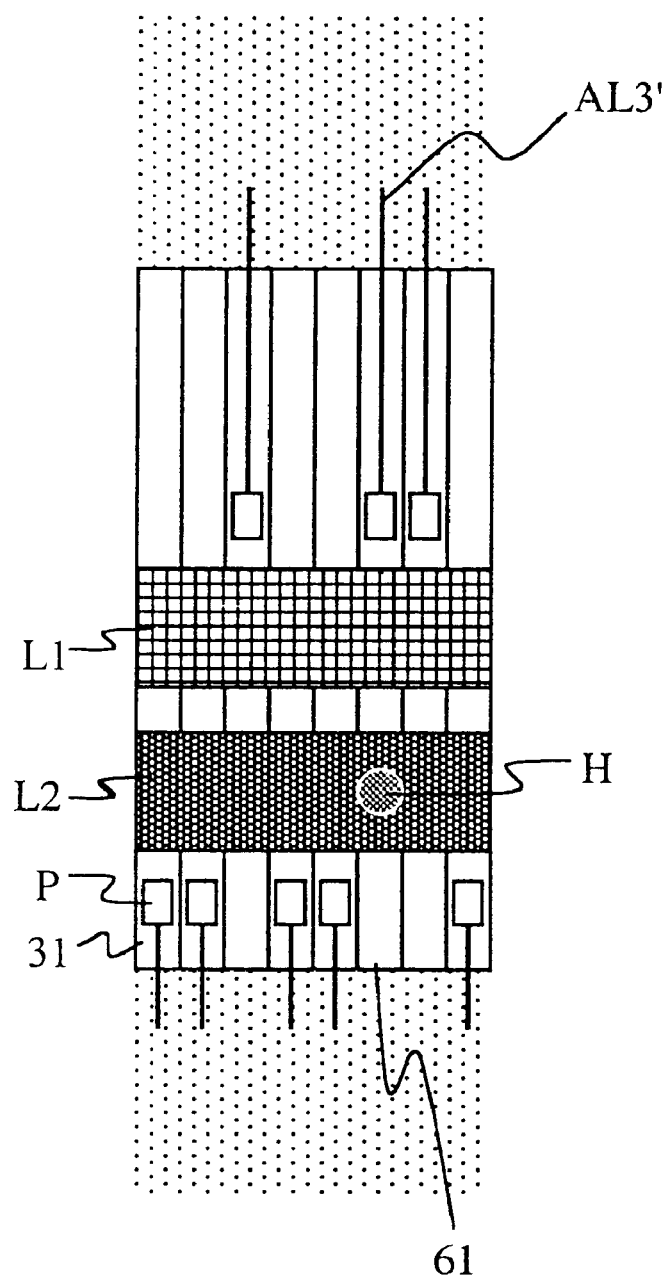
FIG. 5 is a diagram for explaining the I/O buffer in the semiconductor integrated circuit according to the second embodiment.

FIG. 4 is an enlarged view of an I/O buffer in the semiconductor integrated circuit according to the second embodiment. As shown in FIG. 4, in an I/O buffer 61, a pad P is disposed on the chip core area 20 side (the upper side of the sheet) with respect to the Vdd line L1 and the Vss line L2. FIG. 5 is a diagram for explaining the I/O buffer 61. As shown in FIG. 5, in the I/O buffer 61 in which the through hole H is positioned on the Vss line L2, the pad P is disposed on the upper side of the sheet (on the chip core area 20 side) with respect to the Vdd line L1 and the Vss line L2. The pad P and a bump for signal belonging to the group B1 are connected to each other via a line AL3' which is not influenced by the through hole H.

Particularly, as shown in FIG. 5, the I/O buffers 31 and 61 which are different from each other only with respect to the positions of the pads P may be disposed on the same semiconductor integrated circuit. For example, as an I/O buffer having the pad P which has to be connected to a bump for signal belonging to the group B1, the I/O buffer 61 having the pad P positioned on the prebuffer side is disposed. As an I/O buffer having the pad P which has to be connected to the bump for signal belonging to the group B2, the I/O buffer 31 having the pad P positioned on the dicing line side is disposed. By the arrangement, the line can be shortened without by passing, and interference from the final driver 33 with a line and signal interference between lines can be also lessened.

As described above, in the semiconductor integrated circuit according to the second embodiment, by disposing the bumps of the I/O buffers so as to be spread for the pads and placing the pads in positions so that the lines do not have to bypass the through holes in the power source lines (Vdd line L1 and Vss line L2), the routing of the line between the pad and the bump can be simplified, the size of the I/O buffer can be reduced, and the number of I/O buffers, that is, the number of input/output signals can be increased. Particularly, since a line of an assembly board to be routed from an input/output pin in a semiconductor IC as a product to the bump for signal is also simplified, the number of I/O buffers can be easily increased under the constraints of the distance between lines.

A semiconductor integrated circuit according to a third embodiment will now be described. The semiconductor integrated circuit according to the third embodiment is characterized in that pairs of I/O buffers having opposite orientations are disposed in the free spaces at the four corners of the semiconductor integrated circuit.

Figure 6:
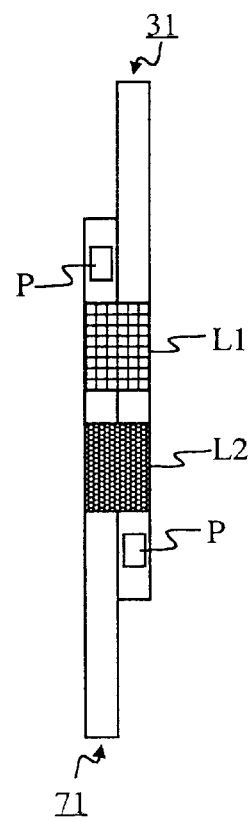
FIG. 6 is a diagram for explaining an I/O buffer in a semiconductor integrated circuit according to a third embodiment.

FIG. 6 is a diagram for explaining an I/O buffer in the semiconductor integrated circuit according to the third embodiment. In FIG. 6, the same parts as those in FIG. 2 are designated by the same reference numerals and their description will not be repeated. In FIG. 6, an I/O buffer 71 is obtained by inverting the orientation of the I/O buffer 31, and the Vdd line L1 and the Vss line L2 are shared by the I/O buffers 71 and 31. Since the Vss line L2 and the Vdd line L1 are disposed in accordance with the order from the pad P side in the I/O buffer 31, when the I/O buffer 71 is obtained by simply inverting the orientation of the I/O buffer 31, the Vdd line L1 and the Vss line L2 cannot be shared by the I/O buffers 31 and 71 in a state where their straight line shapes are maintained.

As shown in FIG. 6, therefore, in the I/O buffer 71, the Vdd line L1 and the Vss line L2 are disposed in accordance with the order from the pad P side. In such a manner, the I/O buffers 31 and 71 whose orientations are opposite to each other can be disposed so as to be adjacent to each other on the common Vdd line L1 and Vss line L2.

Figure 7:
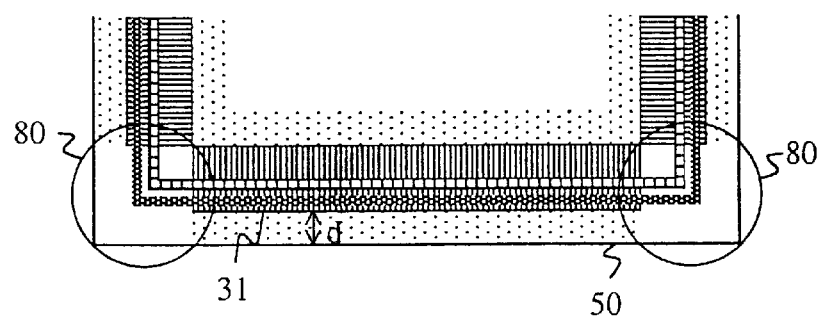
FIG. 7 is a diagram for explaining free areas in the semiconductor integrated circuit according to the third embodiment.

FIG. 7 is a diagram for explaining free areas in a semiconductor integrated circuit. As shown in FIG. 7, circled portions 80 (four corners) are not effectively used as a circuit and are free areas. Consequently, on the basis of the neighboring relation of two I/O buffers shown in FIG. 6, I/O buffers are disposed in the free areas.

Figure 8:
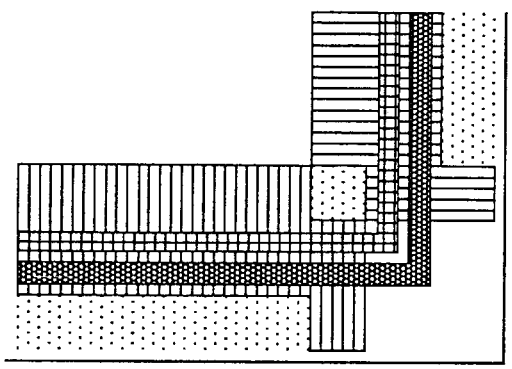
FIG. 8 is a diagram showing a state where I/O buffers are disposed in a free area in the semiconductor integrated circuit according to the third embodiment.
Figure 9:
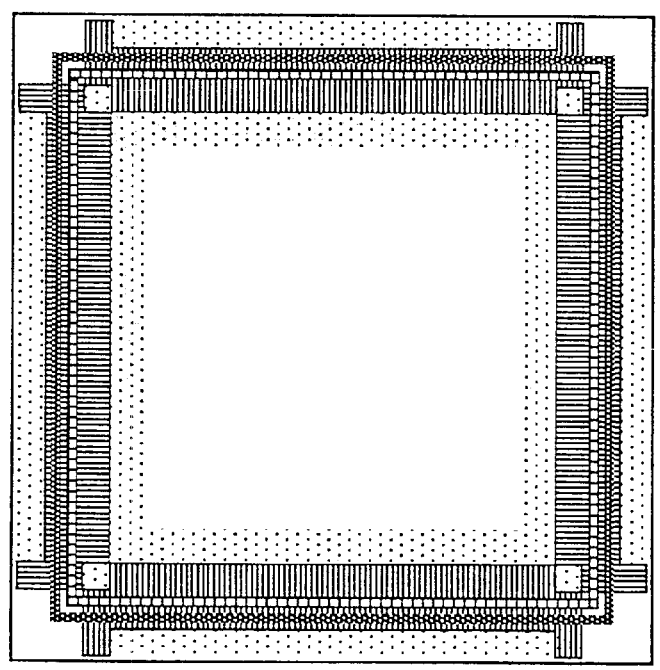
FIG. 9 is a schematic configuration diagram of the semiconductor integrated circuit according to the third embodiment.

FIG. 8 is a diagram showing a state where I/O buffers are disposed in a free area in the semiconductor integrated circuit according to the third embodiment. As shown in FIG. 8, a plurality of I/O buffers 71 are disposed in parallel in the free area so that the maximum number of I/O buffers can be disposed. FIG. 9 is a schematic configuration diagram of the semiconductor integrated circuit according to the third embodiment and shows a state where the I/O buffers 71 are disposed in the free areas at the four corners.

Figure 10:
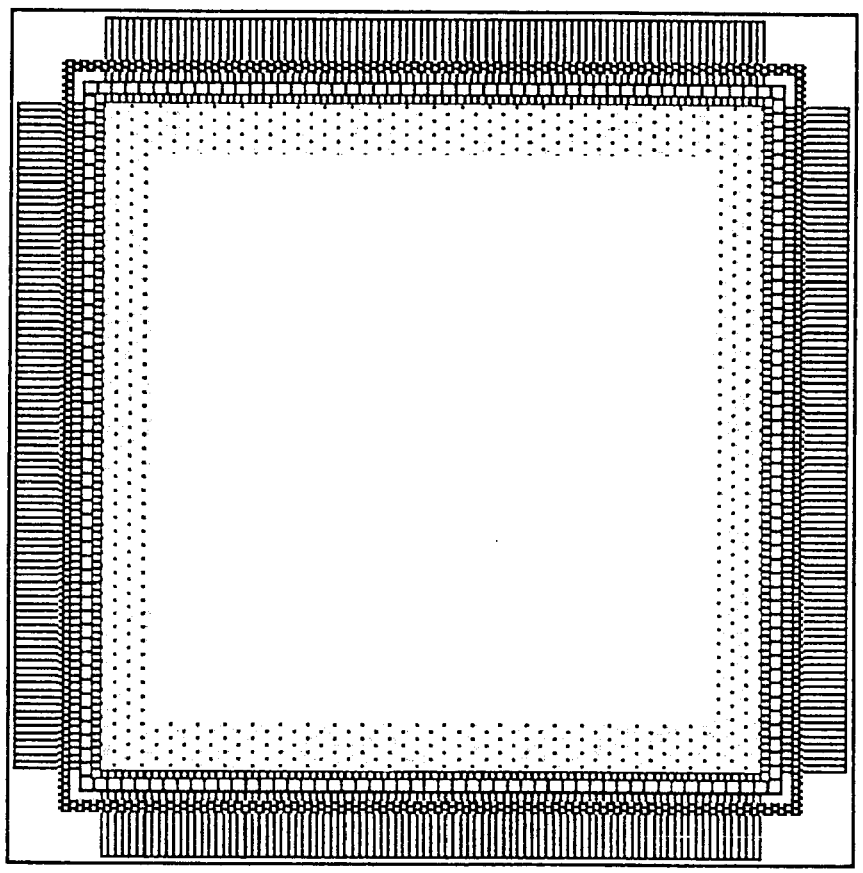
FIG. 10 is a schematic configuration diagram of another semiconductor integrated circuit according to the third embodiment.
Figure 11:
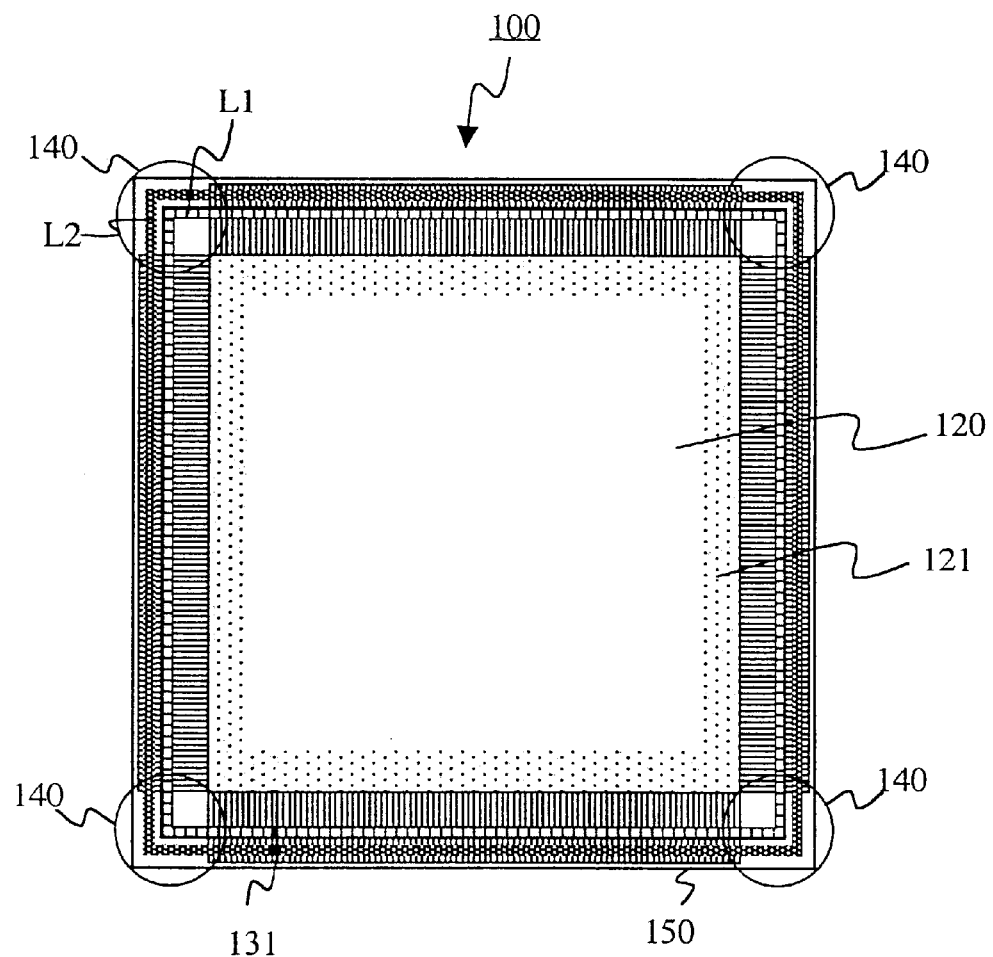
FIG. 11 is a schematic configuration diagram of a conventional semiconductor integrated circuit.

In the semiconductor integrated circuit according to the first embodiment shown in FIG. 1, all of the I/O buffers 31 can be replaced with the I/O buffers 71. FIG. 10 is a schematic configuration diagram of a semiconductor integrated circuit in the case where all the I/O buffers 31 are replaced with the I/O buffers 71. As shown in FIG. 10, all of the prebuffers 32 and the final drivers 33 are disposed on the outside with respect to the Vdd line L1 and the Vss line L2. As a result, the necessary length in each of the Vdd line L1 and the Vss line L2 becomes shorter, so that the costs of materials can be reduced.

As described above, in the semiconductor integrated circuit according to the third embodiment, by disposing the pairs of I/O buffers having opposite orientations in the free areas at the four corners of the chip, the number of input/output signal lines of the semiconductor integrated circuit can be further increased.

As described above, according to one aspect of this invention, the I/O buffers are disposed in the positions sandwiched by the two bump areas. Consequently, effects such that the routing of the lines from the bumps for signals to the I/O buffers can be spread in two directions, the routing of the line between the I/O buffer and the bump for signal is simplified to thereby reduce the size of the I/O buffer, and the number of I/O buffers, that is, the number of input/output signals can be increased are produced.

According to another aspect of this invention, since the first and second I/O buffers having the input/output pads positioned relative to each other are provided, according to the presence or absence of a through hole for connecting the power source line and the GND line, the first and second I/O buffers are selectively properly placed. Consequently, it can be prevented that a bypass line is used as the line connecting the input/output pad and the bump. Effects such that the routing of the line between the pad and the bump is simplified to thereby reduce the size of the I/O buffer, and the number of I/O buffers, that is, the number of input/output signals can be increased are produced.

According to still another aspect of this invention, the second I/O buffers oriented opposite to the first I/O buffers arranged in parallel in the four sides can be disposed at the four corners which are conventionally free areas. An effect such that the number of input/output signals of the semiconductor integrated circuit can be further increased is produced.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor integrated circuit comprising:
   a semiconductor chip having a periphery and a chip core spaced from the periphery;
   a plurality of I/O buffers located along the periphery of said semiconductor chip, each I/O buffer buffering signals input to and output from said chip core;
   a pair of lines including a power line and a ground line, said I/O buffers crossing and receiving power from said power line and said ground line;
   a plurality of input/output pads disposed on said I/O buffers, between said pair of lines and the periphery of said chip, each input/output pad outputting a signal transmitted from said chip core via a corresponding one of said I/O buffers or supplying a received signal to said chip core via the corresponding I/O buffer;
   a plurality of first signal bumps disposed on an inner side with respect to said pair of lines, each first signal bump being connected to at least one of said input/output pads; and
   a plurality of second signal bumps disposed between the periphery of said semiconductor chip and said pair of lines, each second signal bump being connected to one of said input/output pads.

2. A semiconductor integrated circuit comprising:
   a semiconductor chip having a periphery and a chip core spaced from the periphery;
   a plurality of I/O buffers located along the periphery of said semiconductor chip, each I/O buffer buffering signals input to and output from said chip core;
   a pair of lines including a power line and a ground line, said I/O buffers crossing and receiving power from said power line and said ground line;
   a plurality of first input/output pads disposed on said I/O buffers between said pair of lines and the periphery of said semiconductor chip, each first input/output pad outputting a signal transmitted from said chip core via a corresponding one of said I/O buffers, and supplying a received signal to said chip core via the corresponding I/O buffer; and
   a plurality of second input/output pads disposed on said I/O buffers and on an inner side with respect to said pair of lines, each second input/output pad outputting a signal transmitted from said chip core via, corresponding one of said I/O buffers, and supplying a received signal to said chip core via a corresponding one of said I/O buffers;
   a plurality of first signal humps disposed between the periphery of said semiconductor chip and said pair of lines, each first signal bump being connected to at least one of said first input/output pads; and
   a plurality of second signal bumps disposed on the inner side with respect to said pair of lines, each second signal bump being connected to at least one of said second input/output pads.

3. The semiconductor integrated circuit according to claim 2, wherein said semiconductor chip includes four sides and four corners and said I/O buffers include,
   a plurality of first I/O buffers aligned along parts of the four sides of said semiconductor chip; and
   a plurality of second I/O buffers disposed at the four corners of said semiconductor chip so that power line connection portions of said second I/O buffers are connected to power line connection portions of said first I/O buffers, and
   ground line connection portions of said second I/O buffers are connected to ground line connection portions of said first I/O buffers.

4. A semiconductor Integrated circuit comprising:
   a chip core spaced from a periphery of the semiconductor integrated circuit;
   first and second pads located along the periphery of the semiconductor integrated circuit;
   first and second buffers disposed along the periphery of the semiconductor integrated circuit the first buffer buffering at least one of a signal input from the first pad and a signal output to the first pad, the second buffer buffering at one of a signal input from the second pad and a signal output to the second pad;
   a power source line supplying the first and second buffers with power and crossing the first and second buffers;
   a first bump disposed on an inner side with respect to the power source line, the first bump being connected to the first pad; and
   a second bump disposed between the periphery of the semiconductor integrated circuit and the power source line, the second bump being connected to the second pad.

5. The semiconductor integrated circuit according to claim 4, wherein
   the first pad is located on an inner side with respect to the power source line, and
   the second pad is located between the periphery of the semiconductor integrated circuit and the power source line.

6. The semiconductor integrated circuit according to claim 5, wherein
   the first buffer is an I/O buffer for buffering the signal input front the first pad and the signal output to the first pad, and
   the second buffer is an I/O buffer for buffering the signal input from the second pad and the signal output to the second pad.

\* \* \* \* \*